United States Patent
Needes et al.

(10) Patent No.: US 7,722,732 B2
(45) Date of Patent: May 25, 2010

(54) THICK FILM PASTE VIA FILL COMPOSITION FOR USE IN LTCC APPLICATIONS

(75) Inventors: Christopher R. Needes, Chapel Hill, NC (US); Mark Frederick McCombs, Clayton, NC (US); Kumaran Manikantan Nair, Head of the Harbor, NY (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 739 days.

(21) Appl. No.: 11/451,099

(22) Filed: Jun. 12, 2006

(65) Prior Publication Data
US 2006/0228585 A1  Oct. 12, 2006

Related U.S. Application Data

(63) Continuation-in-part of application No. 11/043,576, filed on Jan. 26, 2005, now abandoned.

(51) Int. Cl.
*B32B 9/00* (2006.01)
*C03B 29/00* (2006.01)

(52) U.S. Cl. ............... 156/89.14; 428/701; 428/702; 156/89.12

(58) Field of Classification Search ............ 156/89.14
See application file for complete search history.

(56) References Cited

U.S. PATENT DOCUMENTS

| | | | | |
|---|---|---|---|---|
| 4,218,723 | A | * | 8/1980 | Payne et al. ............ 361/321.4 |
| 4,377,840 | A | * | 3/1983 | Nair .......................... 361/320 |
| 4,392,180 | A | * | 7/1983 | Nair ....................... 361/321.5 |
| 4,536,535 | A | | 8/1985 | Usala |
| 4,654,095 | A | | 3/1987 | Steinberg |
| 4,766,027 | A | | 8/1988 | Burn |
| 4,855,266 | A | | 8/1989 | Burn |
| 5,055,966 | A | * | 10/1991 | Smith et al. ............ 361/321.3 |
| 5,085,720 | A | | 2/1992 | Mikeska et al. |
| 5,106,796 | A | * | 4/1992 | Drozdyk et al. ............ 501/137 |

(Continued)

FOREIGN PATENT DOCUMENTS

DE           4233403           4/1994

(Continued)

OTHER PUBLICATIONS

Sakabe et al., "Ceramics for Ultra-thin Dielectric Layer of Multilayer Ceramic Capacitors", 1998, IEEE, XP10347297, pp. 565-569.*

(Continued)

*Primary Examiner*—Philip C Tucker
*Assistant Examiner*—Alex Efta

(57) ABSTRACT

The present invention is directed to the use of a thick film paste composition comprising, in weight percent total paste composition, materials selected from mixtures of lead iron tungstate niobate solid solutions 30 to 80%, calcined mixtures of barium titanate, lead oxide and fused silica 20 to 70%, barium titanate 30 to 50%, calcined mixtures of barium titanate 30 to 50%, barium titanate and calcined mixtures of barium titanate 30 to 50%, lead oxide and fused silica 50-80%, and a lead germanate glass 3-20%, as a thick film paste via fill composition for use in the formation of multilayer low temperature cofired ceramic circuits.

1 Claim, 4 Drawing Sheets

U.S. PATENT DOCUMENTS

| | | | |
|---|---|---|---|
| 5,117,326 A * | 5/1992 | Sano et al. | 361/321.4 |
| 5,144,526 A | 9/1992 | Vu et al. | |
| 5,254,191 A | 10/1993 | Mikeska et al. | |
| 5,474,741 A | 12/1995 | Mikeska | |
| 6,139,666 A | 10/2000 | Fasano et al. | |
| 6,205,032 B1 | 3/2001 | Shepherd | |
| 6,711,029 B2 | 3/2004 | Fisher et al. | |
| 6,776,861 B2 | 8/2004 | Wang et al. | |
| 6,893,710 B2 | 5/2005 | Lee et al. | |
| 2002/0166694 A1 | 11/2002 | Nishide et al. | |
| 2003/0100146 A1 | 5/2003 | Nakano et al. | |
| 2006/0007636 A1 | 1/2006 | Smith et al. | |

FOREIGN PATENT DOCUMENTS

| | | |
|---|---|---|
| EP | 044076 | 1/1982 |
| EP | 0526707 | 2/1993 |
| JP | 01021911 | 1/1989 |

OTHER PUBLICATIONS

T.C. Reiley, J.V. Badding, D.A. Payne, D.A. Chance (1984) A Low-Temperature Firing Thick Film Capacitor Material Based on Lead Iron Niobate/Tungstate, Material Research Bulletin (19): 1543-1549.

U.S. Appl. No. 10/850,878, filed May 21, 2004, Wang et al.

* cited by examiner

THICK FILM PASTE VIA FILL COMPOSITION FOR USE IN LTCC APPLICATIONS

RELATED APPLICATIONS

This application claims priority to U.S. patent application Ser. No. 11/043,576 filed on Jan. 26, 2005 now abandoned and U.S. patent application Ser. No. 11/043,552 filed on Jan. 26, 2005 now abandoned.

FIELD OF THE INVENTION

This invention relates to a process which produces flat, distortion-free, low-temperature co-fired metallized ceramic (LTCC) bodies, composites, modules or packages from precursor green (unfired) laminates of different dielectric tape chemistries that are configured in a symmetrical arrangement in the z-axis of the laminate. Furthermore, at least one, but not necessarily limited to one, of these chemistries results in a high k core layer that is symmetrically aligned in the z-axis of the substrate with surrounding sheath of low dielectric constant material.

TECHNICAL BACKGROUND OF THE INVENTION

A green tape is formed by casting a thin layer of a slurry dispersion comprising some combination of the following: inorganic additives, glass, ceramic fillers, polymeric binder and solvent(s) onto a flexible substrate, and heating the cast layer to remove the volatile solvent. The green tape is then blanked into master sheets or collected in a roll form. The tape itself is typically used as a dielectric or insulating material for multilayer electronic circuits. A complete description of the types of tape materials used and the associated conductors and resistor materials, and how the circuit is assembled and then processed is provided below.

An interconnect circuit board or package is the physical realization of electronic circuits or subsystems from a number of extremely small circuit elements electrically and mechanically interconnected. It is frequently desirable to combine these diverse type electronic components in an arrangement so that they can be physically isolated and mounted adjacent to one another in a single compact package and electrically connected to each other and/or to common connections extending from the package.

Complex electronic circuits generally require that the circuit be constructed of several levels of conductors separated by corresponding insulating dielectric tape layers. The conductor layers are interconnected through the dielectric layers that separate them by electrically conductive pathways, called via fills.

In all subsequent discussions, it is understood that the use of the term tape layer or dielectric layer implies the presence of metallizations both surface conductor and interconnecting via fills which are co-fired with the ceramic tape. In a like manner, the term laminate or composite implies a collection of metallized tape layers that have been pressed together to form a single entity.

The use of a ceramic-based green tape to make low temperature co-fired ceramic (LTCC) multilayer circuits was disclosed in U.S. Pat. No. 4,654,095 to Steinberg. The co-fired, free sintering process offers many advantages over previous technologies. However, the fired shrinkage tolerance of between ±0.15 and 0.30% for free-sintered LTCC has proved too broad to facilitate the general application of fine-pitch surface mount devices. In this respect it is generally understood that the manufacture of LTCC laminates larger than 6" by 6" is not practical unless the shrinkage tolerance of the LTCC can be substantially reduced below the levels normally attributed to free sintering. Such a reduction may be achieved through the application of constrained sintering technology.

Constrained sintering technology was disclosed by Mikeska in U.S. Pat. No. 5,085,720 and U.S. Pat. No. 5,254,191 where the concept of release-tape-based sintering or PLAS (acronym for pressureless-assisted sintering) was first introduced. In the PLAS process the release tape, which does not sinter to any appreciable degree, acts to pin and restrain any possible x-, y-shrinkage of the laminate. The release tape is removed prior to any subsequent circuit manufacturing operation. Removal is achieved by one of a number of suitable procedures such as brushing, sand blasting or bead blasting. The major benefit of PLAS is a reduction in the shrinkage tolerance to less than 0.04% that enables substrates as large as 10" by 10" to be produced. The capability of being able to make larger substrates with very good positional tolerance has to be balanced against the need to purchase a tape material that does not reside in the final product and the restriction that the top and bottom conductors cannot be co-processed with the laminate. These necessary latter steps may only be carried out following removal of the release tape as part of a post-fired strategy.

A slight modification of the art taught by Mikeska is presented in U.S. Pat. No. 6,139,666 by Fasano et al. where the edges of a multilayer ceramic are chamfered with a specific angle to correct edge distortion, due to imperfect shrinkage control exerted by externally applied release tape during firing.

Shepherd proposed another process for control of registration in an LTCC structure in U.S. Pat. No. 6,205,032. The process fires a core portion of a LTCC circuit incurring normal shrinkage and shrinkage variation of an unconstrained circuit. Subsequent layers are made to match the features of the pre-fired core, which then is used to constrain the sintering of the green layers laminated to the rigid pre-fired core. The planar shrinkage is controlled to the extent of 0.8%-1.2% but is never reduced to zero. In consequence the resultant shrinkage or positional tolerance is higher than the required 0.05%. For this reason, the technique is limited to only a few additional layers before registration becomes unacceptable and component placement becomes impossible.

The presence of large numbers of surface-mount passive components, such as capacitors, has represented a significant limitation on the minimum possible size of a finished circuit. As LTCC design has evolved one strategy for increasing function per unit area and reducing circuit size has been to relocate such surface-mounted components inside the circuit.

Initially the achievement of increased capacitance inside the circuit was achieved through the use of thinner LTCC tape layers of the same chemistry as the bulk material. Such layers might be 25 to 50 micrometers in green (unfired) thickness as compared to the more commonly used 125 or 250 micrometer green thicknesses. The increase in capacitance is inversely proportional to the thickness. For example a 25 micro-meter LTCC tape will produce a maximum capacitance 10 times higher than a 250 micro-meter LTCC tape for the same area. Although impressive, this increase in capacitance does not enable the embedding of many capacitors. It may account for perhaps 10% of the total for filtering and tuning applications (i.e., <100 pico-Farad) in RF circuits, but virtually none in the case of automotive engine controllers where the EMI filtering is important (1 to 10 nano-Farad). The same applies to de-coupling capacitors for power supplies (10 nano-Farad to 1 micro-farad). In the case of the later, the required capacitance values are too high and not practically achievable through the use of thinner LTCC layers. Attainment of such values is only possible through the use of high dielectric constant LTCC materials (k>20<5000) coupled with an increase in the number of interconnected parallel LTCC layers and as a last option, an increase in the area of each capacitor.

It is known that dielectric layers of different chemistries can be directly incorporated into an LTCC multilayer ceramic body. In U.S. Pat. No. 5,144,526, awarded to Vu and Shih, LTCC structures are described whereby high dielectric constant materials are interleaved with layers of low dielectric constant material in a symmetrical arrangement.

The above symmetrical configuration was chosen in order to prevent undesirable cambering of the composite. This requirement represents a limitation to the designer's flexibility to lay out a circuit in the most optimal way. In most cases the designer wants the high k layer to be closer to the top than in the center.

A second less obvious but more significant disadvantage is that the shrinkage of the composite cannot be predicted form the free shrinkages of the individual high and low dielectric constant materials. Furthermore, the three dimensional shrinkage of the composite will vary depending on the proportions and the distribution of the two tapes in the structure. The consequent variations in x-, y-, and z-shrinkage will change capacitor values in such a way that they are unpredictable and can only be fixed by trial and error. In addition, the tolerance of such capacitors becomes excessively high (>30%) which represents another limitation to the utility of the overall concept.

As is taught in U.S. Pat. No. 6,776,861 by Wang et al., it is possible to harness combinations of different dielectric chemistries not only to potentially add higher dielectric constant layers but, through the use of closely matched chemistries, achieve a fired structure or body with a final shrinkage of zero. In other words a new and unique method of constrained sintering has been developed. This invention involves a fired laminate that comprises layers of a primary dielectric tape which define the bulk properties of the final ceramic body and one or more layers of a secondary or self-constraining tape which is fully internal, non-fugitive, non-removable, non-sacrificial and non-release. The purpose of the latter is to constrain the sintering of the primary tape so that the net shrinkage in the x, y direction is zero. However, an additional purpose for the constraining tape could be to introduce a higher dielectric constant material into the structure and this indeed was demonstrated in U.S. Pat. No. 6,776,861. This process is referred to as a self-constraining process and the acronym SCPLAS is applied to it. The shrinkage tolerances achieved by this process are very similar to those achieved by the release-tape based constrained sintering process described by Mikeska et al. The self-constraining tape is placed in strategic locations within the structure and remains part of the structure after co-firing is completed.

In an extension of the above invention U.S. application Ser. No. 10/850,878 Wang et al. describe the use of three LTCC tape chemistries to achieve a self-constrained fired structure with asymmetrically positioned high k tape layers.

Successful combination of different dielectric chemistries in a single laminate requires matching of both the chemical and mechanical properties of the materials. Undesired side reactions and or the formation of unpredicted intermediate phases can impact electrical performance and, through the introduction of residual stresses in the fired structure, major dimensional changes including severe distortion. In general the primary or bulk tape has a fixed chemistry and the modification of it to improve compatibility of the two is not possible. All of the above places significant limitations on the range of materials available. This, in turn, reduces the degrees of freedom available to the formulator of such materials. In other words the development of a high k core material may be limited because of the chemical limits imposed by the need for it to be compatible with the primary or bulk tape.

SUMMARY OF THE INVENTION

The present invention is directed to the use of a thick film paste composition comprising, in weight percent total paste composition, materials selected from mixtures of lead iron tungstate niobate solid solutions 30 to 80%, calcined mixtures of barium titanate, lead oxide and fused silica 20 to 70%, barium titanate 30 to 50%, calcined mixtures of barium titanate 30 to 50%, barium titanate and calcined mixtures of barium titanate 30 to 50%, lead oxide and fused silica 50-80%, and a lead germanate glass 3-20%, as a thick film paste via fill composition for use in the formation of multilayer low temperature cofired ceramic circuits.

BRIEF DESCRIPTION OF THE DRAWINGS

FIG. 1 also provides a simplified representation of how the multilayer capacitors are configured. The structure is shown as symmetrical in the z axis but it can be slightly asymmetrical, i.e., given that all tape layers are the same thickness, the difference in total thickness of the bulk tape above and below the high dielectric constant core can be as much as two equivalent tape layer thicknesses.

DETAILED DESCRIPTION OF THE INVENTION

The current invention combines the teachings of developing high dielectric constant tapes with those of constrained sintering to produce a large area camber-free, co-fired LTCC structure which has predictable shrinkage and provides capacitors of sufficiently high value to provide the required filtering, decoupling and charge storage functions required of a capacitive network.

Figure 1:
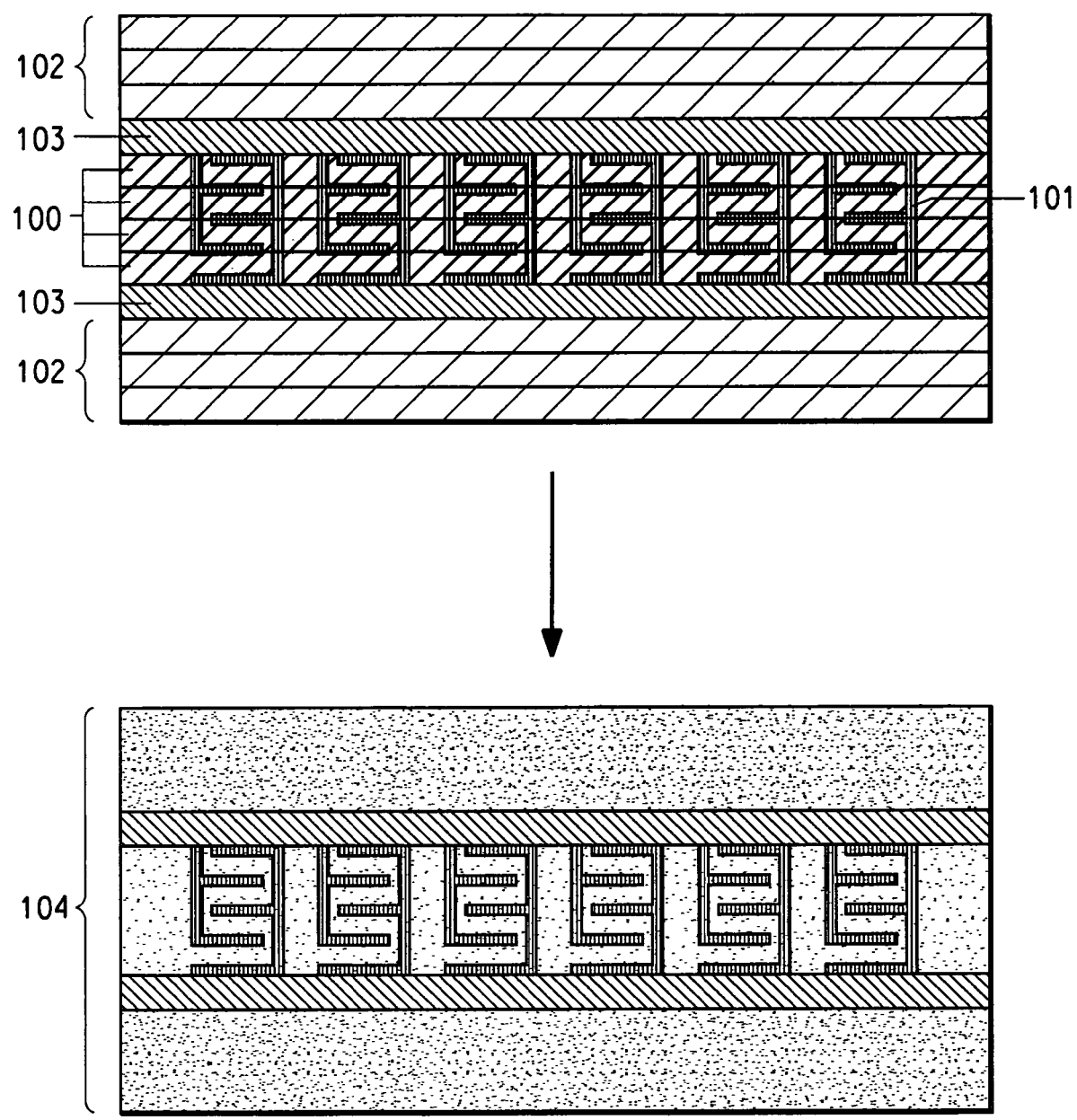
FIG. 1 provides a cross section of the generic circuit with a central core of high dielectric constant material surrounded by a symmetrical outer sheath of low dielectric constant material comprising a combination of both self-constraining and primary tapes.

In a preferred embodiment of this invention shown in FIG. 1, a tape laminate is created using all three tape types discussed in this invention namely, the high dielectric constant (100) the primary (102) and the self-constraining (103) tapes. First, the desired number of high dielectric constant tape layers (100) are each metallized with the required number of individual capacitors (101) as dictated by the design of the capacitor array. Each individual capacitor is created from the high dielectric constant tape by metallizing each layer with an electrode and then using vias to interconnect the electrodes on every other layer. Two interleaved electrode patterns are thus created which strongly resemble a simple multilayer capacitor. The surface area of the electrodes and the number of interconnected layers are adjusted to provide the required capacitance value for each component. Second, at least two layers of self-constraining tape are prepared ready to be applied one each to the top and bottom of the capacitor tape structure. Finally, the required number of layers of primary tape (102) are prepared to complete the outer part of the circuit. All tape layers are collated in the required order, laminated and then fired at 850° C. Once the fired circuit (104) is assembled with active and passive electronic components, all of its analog and digital functions are facilitated by the metallizations and interconnections provided by the primary or low dielectric constant tape layers.

A series of individual high dielectric constant tape (100) sheets are conditioned in an oven at 80° C. for 30 minutes and then blanked (cut to size) and provided with registration holes (punched) in each of the four corners of each sheet. The thickness of the sheets may be as low as 0.001 inch and as thick as 0.015 inches. The preferred thickness is 0.002 to 0.004 inches. All blanked sheets are the same size; however, depending on the circuit design, the manufacturing process and the overall cost of each circuit, the chosen nominal sheet size might be as small as 3 inches by 3 inches or as large as 12 inches by 12 inches. Each sheet is then punched using a high-speed puncher with the required number of via holes. The number of via holes depends on the starting size of the sheet but can vary from 1 to 70000 and is typically in the range of from 100 to 20000.

The via holes on each of the sheets are then filled with thick film via paste by squeegee printing through a screen or a stencil which is pre-patterned so that the holes in the pattern are aligned with the via holes on the sheet. The via-fill paste is made from metal, metal oxide and glass frit powders all suspended in an organic vehicle solvent system to make the material printable. The paste in the via holes is then dried for 20 to 30 minutes at 120° C. to 150° C. by putting the sheets in an oven or on a conveyer belt dryer. Temperature and time are dictated by the efficiency of the drying equipment. As used herein, the terms "thick film paste," "thick film conductor paste or "thick film conductor via paste" refer to dispersions of finely divided solids in an organic medium, which are of paste consistency and have a rheology suitable for screen printing and spray, dip or roll-coating. The organic media for such pastes are ordinarily comprised of liquid binder polymer and various rheological agents dissolved in a solvent, all of which are completely pyrolyzed during the firing process. Such pastes can be either resistive or conductive and, in some instances, may even be dielectric in nature. Such compositions may or may not contain an inorganic binder, depending upon whether or not the functional solids are sintered during firing. Conventional organic media of the type used in thick film pastes are also suitable for the constraining layer. A more detailed discussion of suitable organic media materials can be found in U.S. Pat. No. 4,536,535 to Usala.

The topside thick film conductor paste, in this case to pattern and define the capacitor electrodes, is then applied to each of the sheets by the same type of squeegee printing process as is used for the via fill paste. The formulation of the topside conductor paste metallization is slightly different to that of the via fill paste but does contain metal powder and an organic vehicle solvent system again to make it printable. Other components might be added to impart a particular function to the conductor; however, the number and type of additives is generally minimized. This is because a capacitor termination must be as inert as possible to avoid any fluxing reactions and a resultant reduction in the effective dielectric constant of the high dielectric constant tape. The metallized sheets are again placed in an oven or other heating device this time to dry the topside metallization.

In some rare cases a backside conductor paste metallization might also be applied and this would be done in the same way as the topside conductor paste metallization.

In a like manner to that described above the required number of self constraining (103) and primary (102) tape layers are prepared. The thickness of the self constraining tape may vary from 0.001 to 0.005" but the preferred range is 0.002 to 0.004"; that of the primary tape might vary from 0.001" to 0.020" but the preferred range is from 0.002" to 0.010". The numbers of vias per sheet are similar to those quoted previously. Via filling and topside metallization processing are the same as before.

Once all the individual tape processing steps are completed, the layers are collated and then laminated at 2000 to 5000 psi at 60 to 80° C. A confined uniaxial or isostatic pressing die is used for lamination and to ensure precise alignment between layers. The laminate is trimmed with a hot stage cutter and then fired at 850° C. until sintering is complete and a fully-fired structure (104) produced. Firing options include conveyer and box furnaces with a programmed heating cycle. The cycle time of the firing process is adjusted so that optimal performance of the core is achieved and this may be as short as 2 to 6 hours in a conveyer furnace and as long as 12 to 36 hours in a box furnace.

The above is the basic method for making a circuit. It is a constrained sintered strategy in that the presence of the self-constraining tape in the laminate controls both the absolute x- and y-shrinkage of the laminate to less than 0.3% and the reproducibility of this shrinkage to less than 0.04%. However, this result is not achievable, neither is a flat distortion-free, mechanically strong substrate possible without good chemical and mechanical matching of the three tapes used.

Figure 2:
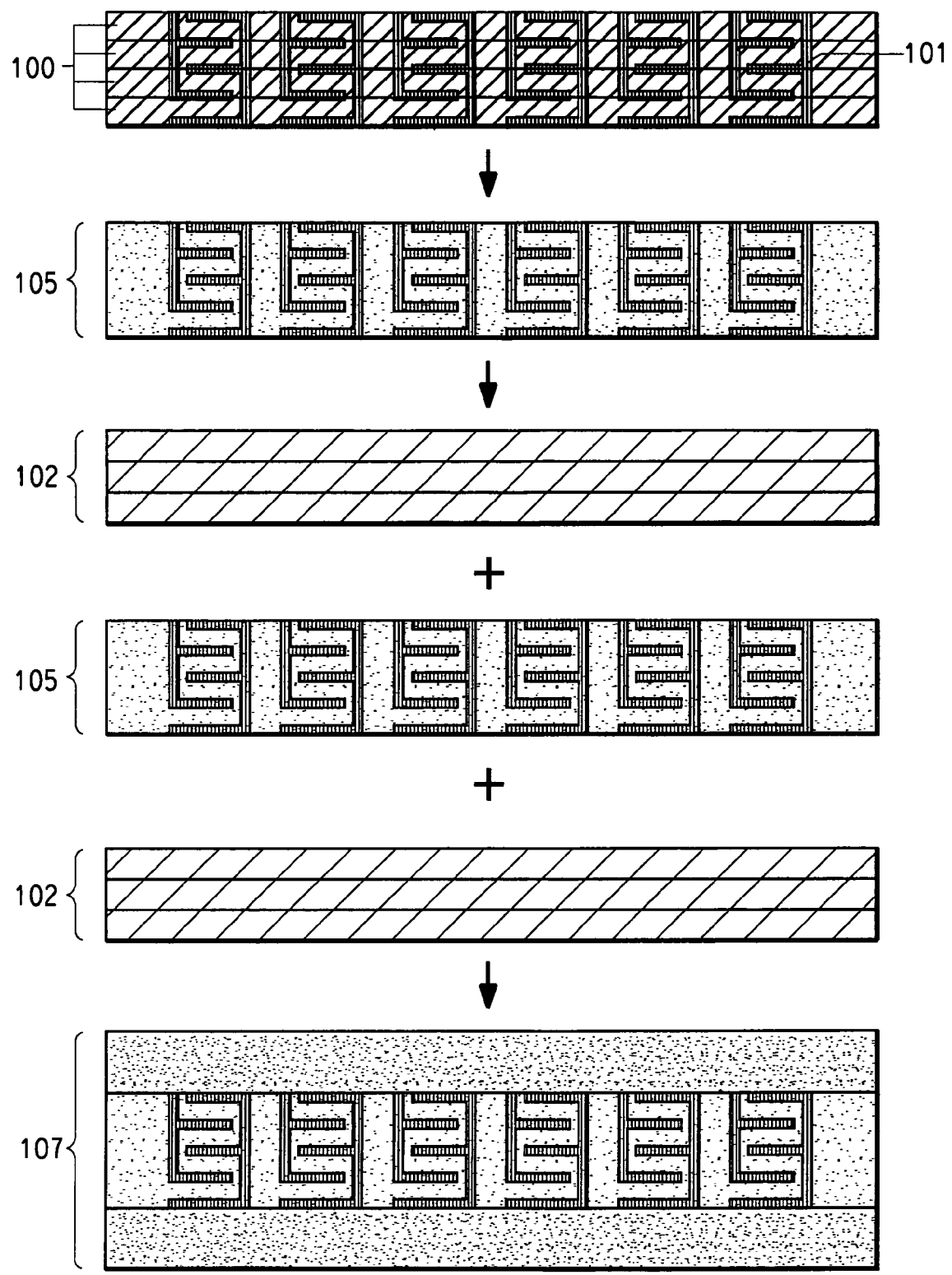
FIG. 2 illustrates a process variation that does not use self-constraining tape and is carried out in two firing steps. The central core of high dielectric constant material is processed first. After the first firing additional layers of metallized primary tape are applied to the top and bottom of the fired core and then the whole is fired.

If self-constraining tape (103) is not included in the process, then co-firing of the high dielectric constant and primary tapes alone gives less predictable results than the process illustrated in FIG. 1. For example, the final shrinkage of the composite can only be found by trial and error and the overall dimensional tolerance of the circuit is inferior to that achieved by the basic method. Co-firing in the absence of the self-constraining tape results in an x-, y-shrinkage in the 4 to 8% range, depending on configuration. Configuration is defined as the overall ratio of high dielectric constant to primary tape layers. This renders the design and manufacture of a circuit more complex and thus, more costly. In such a case a two step process, as described in FIG. 2, is to be preferred. The high dielectric constant core (105) is processed first. Its individual shrinkage is more predictable and, once fired, it is sufficiently strong mechanically and rigid to act as a substrate. Moreover, its dimensions will not change during subsequent firing steps. The primary tape (103) layers are then prepared and laminated to the core material in a sequential manner. During firing of the final laminate, the shrinkage of the primary tape is constrained by the previously fired core. This produces much higher tolerance circuitry than with the co-fired case.

Figure 3:
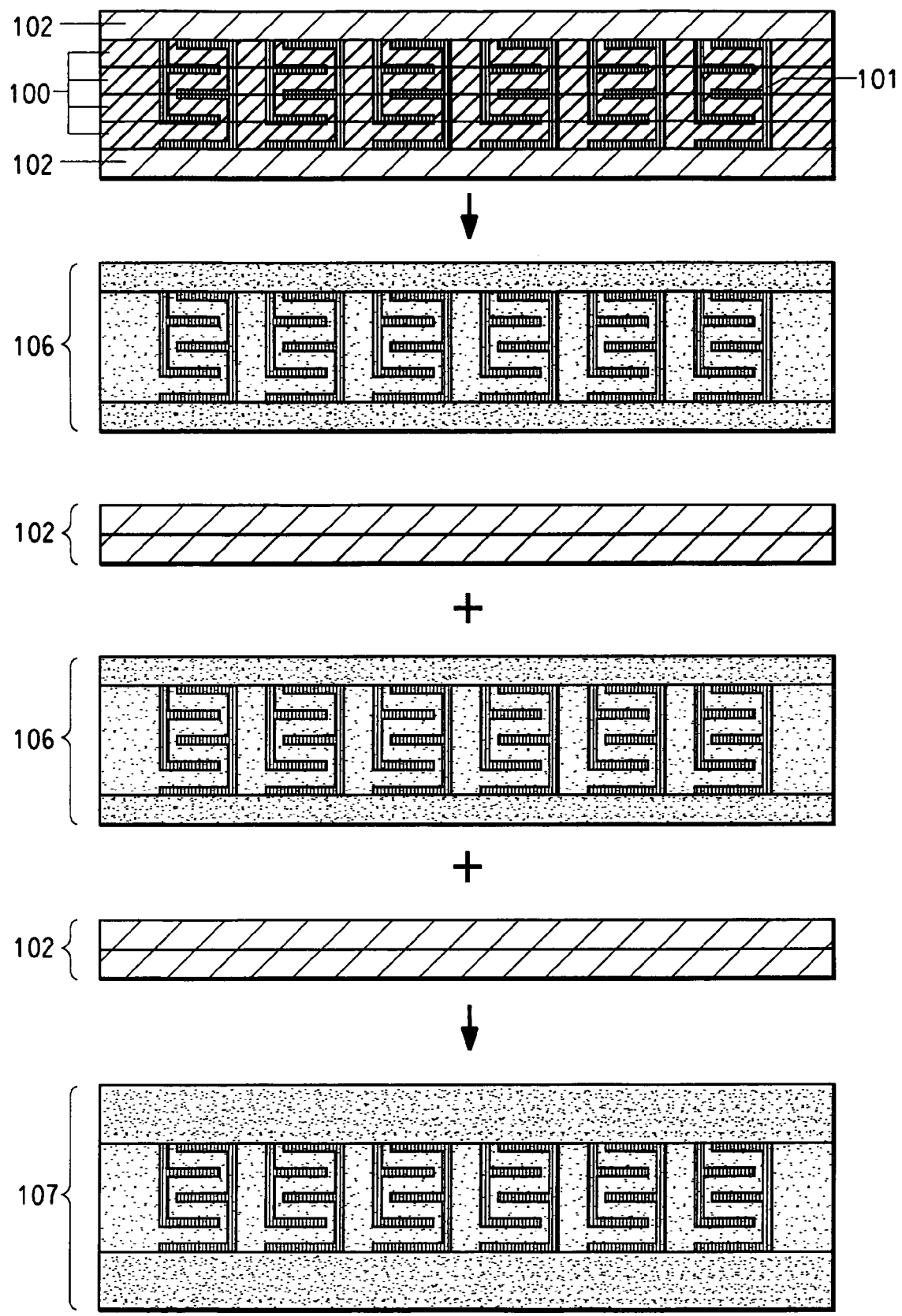
FIG. 3 provides a variation of the process shown in FIG. 2. In this the central core of high dielectric constant tape is laminated with a layer of metallized primary tape on top and bottom and then fired. Additional primary tape layers are then applied and the completed structure is then fired for a second time.
Figure 4:
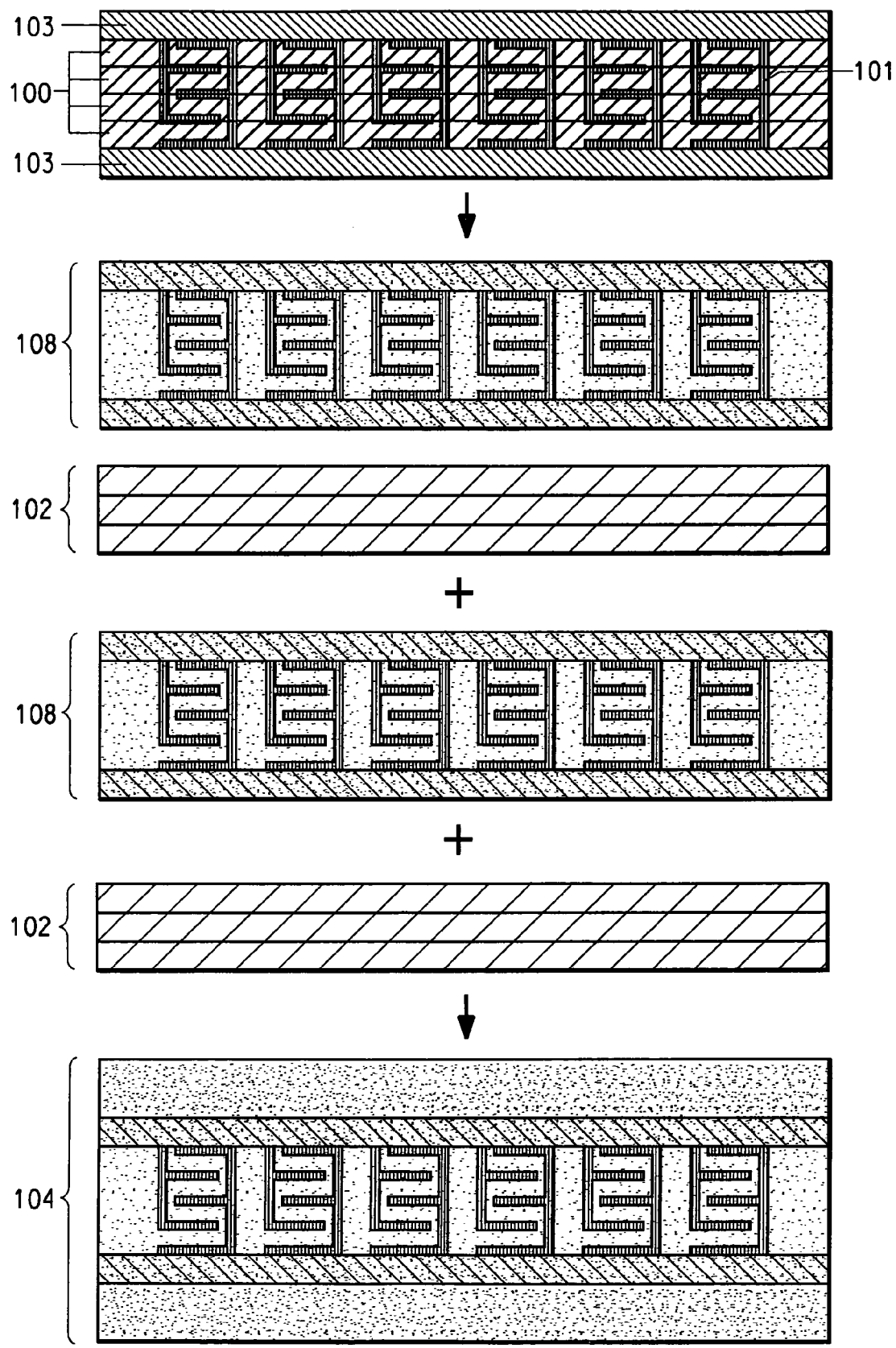
FIG. 4 represents a variation on the process in FIG. 1. Like the processes in FIGS. 2 and 3 it is a two firing step process, but unlike them it does use self-constraining tape. In the first step a laminate comprising the high dielectric constant core with a layer of self-constraining tape on top and bottom is prepared and fired. The circuit is then completed by the application of additional layers of metallized primary tape top and bottom and then fired.

Other variations of the two methods described in FIGS. 1 and 2 are possible. Two examples are shown in FIGS. 3 and 4 where some slightly different combinations of sequentially and co-fired tapes were evaluated. Both are effective but possess disadvantages compared to the preferred methods based on FIGS. 1 and 2.

Preferred glasses for use in the primary tape comprise the following oxide constituents in the compositional range of: $SiO_2$ 52-54, $Al_2O_3$ 12.5-14.5, $B_2O_3$ 8-9, CaO 16-18, MgO 0.5-5, $Na_2O$ 1.7-2.5, $Li_2O$ 0.2-0.3, SrO 0-4, $K_2O$ 1-2 in weight %. The more preferred composition of glass being: $SiO_2$ 53.50, $Al_2O_3$ 13.00, $B_2O_3$ 8.50, CaO 17.0, MgO 1.00 perature (1450-1600° C.) and for a time such that the melt becomes entirely liquid and homogeneous. The glass melts were then quenched by counter rotating stainless steel roller to form a 10-20 mil thick platelet of glass. The resulting glass platelet was then milled to form a powder with its 50% volume distribution set between 1-5 microns. The glass powders were then formulated with filler and organic medium to cast tapes as detailed in the Examples section. The glass compositions shown in Table 1 represent a broad variety of glass chemistry (high amounts of glass former to low amounts of glass former). The glass former oxides are typically small size ions with high chemical coordination numbers such as $SiO_2$, $B_2O_3$, and $P_2O_5$. The remaining oxides represented in the table are considered glass modifiers and intermediates.

TABLE 1

(wt. %)

| Glass # | $SiO_2$ | $Al_2O_3$ | PbO | $ZrO_2$ | $B_2O_3$ | CaO | BaO | MgO | $Na_2O$ | $Li_2O$ | $P_2O_5$ | $TiO_2$ | $K_2O$ | $Cs_2O$ | $Nd_2O_3$ |
|---|---|---|---|---|---|---|---|---|---|---|---|---|---|---|---|
| 1 | | | | | 6.08 | 23.12 | | | | | 5.40 | 34.25 | | | 32.05 |
| 2 | 13.77 | | | 4.70 | 26.10 | | 14.05 | 35.09 | | 1.95 | 4.34 | | | | |
| 3 | 55.00 | 14.00 | | | 9.00 | 17.50 | | 4.50 | | | | | | | |
| 4 | | | | | 11.91 | | 21.24 | | | 0.97 | 4.16 | 26.95 | | 4.59 | 30.16 |
| 5 | 56.50 | 9.10 | 17.20 | | 4.50 | 8.00 | | 0.60 | 2.40 | | | | 1.70 | | |
| 6 | | | | | 11.84 | | 21.12 | | | 1.31 | 4.14 | 25.44 | | 6.16 | 29.99 |
| 7 | 52.00 | 14.00 | | | 8.50 | 17.50 | | 4.75 | 2.00 | 0.25 | | | 1.00 | | |
| 8 | | | | | 6.27 | 22.79 | | | | 0.93 | 4.64 | 33.76 | | | 31.60 |
| 9 | | | | | 9.55 | | 21.73 | | | 0.92 | 4.23 | 32.20 | | 1.24 | 30.13 |
| 10 | | | | | 10.19 | | 21.19 | | | 0.97 | 4.15 | 28.83 | | 4.58 | 30.08 |
| 11 | 13.67 | | | 5.03 | 25.92 | | 13.95 | 34.85 | | 1.94 | 4.64 | | | | |
| 12 | 12.83 | | | 4.65 | 21.72 | | 13.09 | 34.09 | | 1.96 | 11.65 | | | | |
| 13 | 13.80 | | | 4.99 | 25.86 | | 13.34 | 33.60 | | 2.09 | 4.35 | | | 1.87 | |
| 14 | 52.00 | 14.00 | | | 9.00 | 17.50 | | 5.00 | 1.75 | 0.25 | | | 0.50 | | |

| | $SiO_2$ | $Al_2O_3$ | SrO | $ZrO_2$ | $B_2O_3$ | CaO | BaO | MgO | $Na_2O$ | $Li_2O$ | $P_2O_5$ | $TiO_2$ | $K_2O$ | $Cs_2O$ | $Nd_2O_3$ |
|---|---|---|---|---|---|---|---|---|---|---|---|---|---|---|---|
| 15 | 53.5 | 13.00 | 3.00 | | 8.50 | 17.00 | | 1.00 | 2.25 | 0.25 | | | 1.50 | | |
| 16 | 13.77 | | | 4.70 | 22.60 | | 14.05 | 35.09 | | 1.95 | 7.84 | | | | |

$Na_2O$ 2.25, $Li_2O$ 0.25, SrO 3.00, $K_2O$ 1.50 in weight %. In the primary tape the $D_{50}$ (median particle size) of frit is preferably in the range of, but not limited to, 0.1 to 5.0 micrometers and more preferably 0.3 to 3.0 micrometers.

Preferred glass compositions found in the self-constraining tape comprise the following oxide constituents in the compositional range of: $B_2O_3$ 6-13, BaO 20-22, $Li_2O$ 0.5-1.5, $P_2O_5$ 3.5-4.5, $TiO_2$ 25-33, $Cs_2O$ 1-6.5, $Nd_2O_3$ 29-32 in weight %. The more preferred composition of glass being: $B_2O_3$ 11.84, BaO 21.12, $Li_2O$ 1.31, $P_2O_5$ 4.14, $TiO_2$ 25.44, $Cs_2O$ 6.16, $Nd_2O_3$ 29.99 in weight %. Another preferred glass comprises the following oxide constituents in the compositional range of: $SiO_2$ 12-14, $ZrO_2$ 3-6, $B_2O_3$ 20-27, BaO 12-15, MgO 33-36, $Li_2O$ 1-3, $P_2O_5$ 3-8, $Cs_2O$ 0-2 in weight %. The preferred composition of glass being: $SiO_2$ 13.77, $ZrO_2$ 4.70, $B_2O_3$ 26.10, BaO 14.05, MgO 35.09, $Li_2O$ 1.95, $P_2O_5$ 4.34 in weight %. In the self-constraining tape the $D_{50}$ (median particle size) of frit is preferably in the range of, but not limited to, 0.1 to 5.0 micrometers and more preferably 0.3 to 3.0 micrometers.

Specific examples of glasses that may be used in the primary or self-constraining tapes are listed in Table 1.

The glasses described herein are produced by conventional glass making techniques. The glasses were prepared in 500-1000 gram quantities. Typically, the ingredients are weighed then mixed in the desired proportions and heated in a bottom-loading furnace to form a melt in platinum alloy crucibles. As well-known in the art, heating is conducted to a peak tem- Ceramic filler such as $Al_2O_3$, $ZrO_2$, $TiO_2$, $BaTiO_3$ or mixtures thereof may be added to the castable composition used to form the tapes in an amount of 0-50 wt. % based on solids. Depending on the type of filler, different crystalline phases are expected to form after firing. The filler can control dielectric constant and loss over the frequency range. For example, the addition of $BaTiO_3$ can increase the dielectric constant significantly.

$Al_2O_3$ is the preferred ceramic filler since it reacts with the glass to form an Al-containing crystalline phase. $Al_2O_3$ is very effective in providing high mechanical strength and inertness against detrimental chemical reactions. Another function of the ceramic filler is rheological control of the entire system during firing. The ceramic particles limit flow of the glass by acting as a physical barrier. They also inhibit sintering of the glass and thus facilitate better burnout of the organics. Other fillers, α-quartz, $CaZrO_3$, mullite, cordierite, forsterite, zircon, zirconia, $BaTiO_3$, $CaTiO_3$, $MgTiO_3$, $SiO_2$, amorphous silica or mixtures thereof may be used to modify tape performance and characteristics. It is preferred that the filler has at least a bimodal particle size distribution with D50 of the larger size filler in the range of 1.5 and 2 micrometers and the D50 of the smaller size filler in the range of 0.3 and 0.8 micrometers.

In the formulation of self-constraining and primary tape compositions, the amount of glass relative to the amount of ceramic material is important. A filler range of 20%-40% by weight is considered desirable in that the sufficient densification is achieved. If the filler concentration exceeds 50% by wt., the fired structure is not sufficiently densified and is too porous. Within the desirable glass/filler ratio, it will be apparent that, during firing, the liquid glass phase will become saturated with filler material.

For the purpose of obtaining higher densification of the composition upon firing, it is important that the inorganic solids have small particle sizes. In particular, substantially all of the particles should not exceed 15 µm and preferably not exceed 10 µm. Subject to these maximum size limitations, it is preferred that at least 50% of the particles, both glass and ceramic filler, be greater than 1 µm and less than 6 µm.

The high dielectric constant core tape has a dielectric constant of at least 20. In one embodiment, the dielectric constant is in the range of 20-5000. A precursor green laminate comprising one or more layers of the high dielectric constant tape is provided to form a high dielectric constant ceramic core after firing. Typically, the precursor laminate comprises one to ten layers of core tape. In one embodiment, the precursor laminate comprises two to ten layers of core tape.

Preferred ceramic inorganic and glass materials found in the core tape comprise the constituents, in weight percent, selected from: mixtures of lead iron tungstate niobate solid solutions 30%-80%, calcined mixtures of barium titanate, lead oxide and fused silica 20%-70%, barium titanate 30% to 50%, and/or calcined mixtures of barium titanate, lead oxide and fused silica 50%-80%, and a lead germanate glass 3%-20%.

Specific examples of some compositions that may be used for the high dielectric constant core tape are provided below.

Tape with a dielectric constant k of 2000 contained a solid solution of lead iron niobate and lead iron tungstate 40%, calcined mixture of $BaTiO_3$, PbO, and fused $SiO_2$ 40%, and an organic medium (see below) 20%.

Tape with a dielectric constant k of 500 contained BaTiO3 66%, lead germanate glass 4%, which comprises 78.5% Pb3O4 and 21.5% GeO2, and an organic medium (see below) 30%.

Tape with a k of 60 contained a calcined mixture of BaTiO3, Pb3O4 and BaO 70%, with a lead germanate glass 10%, which comprises 78.5% Pb3O4 and 21.5% GeO2, and an organic medium (see below) 20%.

In the core tape the $D_{50}$ ($D_{50}$ refers to median particle size, so that half of the sample consists of larger particles and the other half consists of smaller particles) of the constituents is preferably in the range of, but not limited to, 0.01 to 5.0 micrometers and more preferably 0.04 to 3.0 micrometers.

The organic medium in which the glass and ceramic inorganic solids are dispersed is comprised of a polymeric binder which is dissolved in a volatile organic solvent and, optionally, other dissolved materials such as plasticizers, release agents, dispersing agents, stripping agents, antifoaming agents, stabilizing agents and wetting agents.

To obtain better binding efficiency, it is preferred to use at least 5% wt. polymer binder for 90% wt. solids, which includes glass and ceramic filler, based on total composition. However, it is more preferred to use no more than 30% wt. polymer binder and other low volatility modifiers such as plasticizer and a minimum of 70% inorganic solids. Within these limits, it is desirable to use the least possible amount of binder and other low volatility organic modifiers, in order to reduce the amount of organics which must be removed by pyrolysis, and to obtain better particle packing which facilitates full densification upon firing.

In the past, various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly (methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

U.S. Pat. No. 4,536,535 to Usala, issued Aug. 20, 1985, has disclosed an organic binder which is a mixture of compatible multipolymers of 0-100% wt. $C_{1-8}$ alkyl methacrylate, 100%-0% wt. $C_{1-8}$ alkyl acrylate and 0-5% wt. ethylenically unsaturated carboxylic acid of amine. Because the above polymers can be used in minimum quantity with a maximum quantity of dielectric solids, they are preferably selected to produce the dielectric compositions of this invention. For this reason, the disclosure of the above-referred Usala application is incorporated by reference herein.

Frequently, the polymeric binder will also contain a small amount, relative to the binder polymer, of a plasticizer that serves to lower the glass transition temperature (Tg) of the binder polymer. The choice of plasticizers, of course, is determined primarily by the polymer that needs to be modified. Among the plasticizers which have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate and poly (isobutylene). Of these, butyl benzyl phthalate is most frequently used in acrylic polymer systems because it can be used effectively in relatively small concentrations.

The solvent component of the casting solution is chosen so as to obtain complete dissolution of the polymer and sufficiently high volatility to enable the solvent to be evaporated from the dispersion by the application of relatively low levels of heat at atmospheric pressure. In addition, the solvent must boil well below the boiling point or the decomposition temperature of any other additives, contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1, 3-monoisobutyrate, toluene, methylene chloride and fluorocarbons. Individual solvents mentioned above may not completely dissolve the binder polymers. Yet, when blended with other solvent(s), they function satisfactorily. This is well within the skill of those in the art. A particularly preferred solvent is ethyl acetate since it avoids the use of environmentally hazardous chlorocarbons.

In addition to the solvent and polymer, a plasticizer is used to prevent tape cracking and provide wider latitude of as-coated tape handling ability such as blanking, printing, and lamination. A preferred plasticizer is BENZOFLEX® 400 manufactured by Rohm and Haas Co., which is a polypropylene glycol dibenzoate.

Applications

The low temperature cofired ceramic structures of the present invention may be used to form functioning electronic circuits. In one embodiment, the circuits of the present invention comprise internal or embedded capacitors providing values of from 10 pico-farads to 100 nano-farads.

Circuits made using the teachings of the current invention may be applied to all areas of ceramic packaging. For example, they can be used in, but not limited to automotive applications such as engine and transmission controllers and anti-lock breaking systems including the sensors necessary for their operation, as well as, higher frequency applications, such as satellite radio and radar. Although the latter find good application in the automotive area, they also can be applied to the wireless and military segment.

In general, the higher the frequency of application, the lower the required dielectric constant of the core: however where partitioned analog, digital and RF functions are integrated within one circuit the core may well need to have a high dielectric constant component as well.

Thick Film Paste Applications

One embodiment of the present invention is the formation of a thick film paste via fill capacitor composition. These via fill compositions are via fill capacitor composition, which are functional and are integrated into multilayer LTCC device. This is functionally and compositionally distinguishable from standard conductor via fill compositions. Typical via fill conductor compositions comprise a functional phase of metals. The present invention thick film paste via fill capacitor composition comprises no functional phase of metals (i.e., no metals). The composition of the present invention may be formed into a thick film paste composition comprising, in weight percent total thick film composition, materials (inorganic solids) selected from mixtures of lead iron tungstate niobate solid solutions 30 to 80%, calcined mixtures of barium titanate, lead oxide and fused silica 20 to 70%, barium titanate 30 to 50%, calcined mixtures of barium titanate 30 to 50%, barium titanate and calcined mixtures of barium titanate 30 to 50%, lead oxide and fused silica 50 to 80%, and a lead germanate glass 3 to 20%, for use in via fill applications (i.e., for use as a thick film paste via fill composition, as described below). Additionally, one embodiment of the present invention is the use of a thick film paste composition comprising, in weight percent total paste composition, a solid solution of lead iron niobate and lead iron tungstate 40%, a calcined mixture of $BaTiO_3$, PbO, and fused $SiO_2$ 40%, and an organic medium 20%, as a thick film paste via fill composition for use in the formation of multilayer low temperature cofired ceramic circuits. A further embodiment is the use of a thick film paste composition comprising, in weight percent total paste composition, BaTiO3 66%, lead germanate glass 4%, and an organic medium 30% and wherein said lead germanate glass comprises, in weight percent, 78.5% Pb3O4 and 21.5% GeO2, as a thick film paste via fill composition for use in the formation of multilayer low temperature cofired ceramic circuits. Yet another embodiment is the use of a thick film paste composition comprising, in weight percent total paste composition, a calcined mixture of $BaTiO_3$, Pb3O4, and BaO 70%, a lead germanate glass 10%, and an organic medium 20%, as a thick film paste via fill composition for use in the formation of multilayer low temperature cofired ceramic circuits.

The ratio of vehicle (organic medium) to inorganic solids in the dispersions can vary considerably and depends upon the manner in which the dispersion is to be applied and the kind of vehicle used. The organic medium in which the glass and ceramic inorganic solids are dispersed is comprised of a polymeric binder which is dissolved in a volatile organic solvent and, optionally, other dissolved materials such as plasticizers, release agents, dispersing agents, stripping agents, antifoaming agents, stabilizing agents and wetting agents. The same glasses, ceramic inorganic solids, polymeric binders and volatile organic solvents used to make the tape composition, as described above, may be used in some embodiments to form the thick film paste via fill compositions.

Normally to achieve good coverage the dispersions will comprise 60-98% solids and 40-2% organic medium (vehicle). In one embodiment, the organic medium is present in the amount of 20 weight percent total thick film paste via fill composition.

These via fill applications are particularly useful in the formation of Low Temperature Cofired Ceramic (LTCC) structures. Furthermore, these via fill compositions may be used in conjunction with uncured ceramic material, such as Green Tape™ Low Temperature Cofired Ceramic (LTCC), and various other paste components, to form a multilayer electronic circuit. Green Tape™ is typically used as a dielectric or insulating material for multilayer electronic circuits. Several uncured ceramic materials which are useful in forming the multilayer electronic circuit useful with the thick film paste via fill composition are Product Nos. 943 and 957 Green Tape™ available from E. I. du Pont de Nemours and Company.

A sheet of Green Tape™ is blanked with registration holes in each corner to a size somewhat larger than the actual dimensions of the circuit. To electrically connect various layers of the multilayer circuit, via holes are formed in the Green Tape™. This is typically done by mechanical punching however any suitable method may be utilized. For example, a sharply focused laser can be used to volatilize and form via holes (in which the via fill composition is applied) in the Green Tape™.

Partially or completely filling the vias with a thick film paste via fill composition(s) (sometimes called capacitor via fill compositions) of the present invention followed by a conductor composition printed as "caps" over the capacitor via-fills on both sides of the tape at which forms the "electroded via-capacitors". The capacitance value could easily be controlled by controlling the thickness of the Green tapes, the thickness of the vias by filling the vias either partially or completely and/or controlling the size of the vias. Several via-fill capacitors could be connected in parallel and/or series to increase the total capacitance of the circuit.

Furthermore via-fill capacitors could be connected with standard layer-type capacitors. These process variations could benefit the circuit designer to custom-built the circuits with very specific functions. By interchanging the thickness of the same tape and/or different tapes one could also design circuits for specific functions. These "capacitor via-fill composition(s)" are usually applied by standard screen printing techniques, however, any suitable application technique may be employed. Each "electroded via-capacitors" is connected to the circuitry typically by screen printing conductor tracks. These tracks can utilize any conductor composition compatible to the green tapes or other suitable substrate compositions, or a combination thereof. Also, resistor inks or any other high dielectric constant inks can be printed on selected layer(s) to form standard resistive or capacitive circuit elements. Conductors, resistors, capacitors and any other components are typically formed by conventional screen printing techniques and are deemed as functional layers.

The outermost layers of the circuit are used to attach components. Components are typically wire-bonded, glued or soldered to the surface of fired parts. After each layer of the circuit is completed, the individual layers are collated and laminated. A confined uniaxial or isostatic pressing die is typically used to ensure precise alignment between layers. The assemblies are trimmed to an appropriate size after lamination or after firing. Firing is typically carried out in a conveyor belt furnace or in a box furnace with a programmed heating cycle. The tape may be either constrained or free sintered during the firing process. For example, the methods disclosed in U.S. Pat. No. 4,654,095 to Steinberg and U.S. Pat. No. 5,254,191 to Mikeska may be utilized, as well as others known to those skilled in the art.

As used herein, the term "firing" means heating the assembly in an oxidizing atmosphere, such as air to a temperature, and for a time sufficient to volatilize (burn-out) the organic material in the layers of the assemblage and allow reaction and sintering of the inorganic components of both the tape and conductors. "Firing" causes the inorganic components in the layers, to react or sinter, and thus densify the entire assembly, thus forming a fired article. This fired article may be a multilayered circuit used in telecommunications, military or automotive applications (such as automotive position sensors, radar, transmit receive modules, antennas etc).

The term "functional layer" refers to the printed Green Tape™, which has conductive, resistive, capacitive or dielectric functionality. Thus, as indicated above, a typical Green Tape™ layer may have contain one or more via capacitors, standard capacitors, conductive traces, conductive vias, and/or resistors.

As noted above, some embodiments of the composition(s), multilayer circuit(s) and device(s) of the present invention are particularly useful in microwave applications. "Microwave applications" are defined herein as applications which require a frequency in the range of 300 MHz to 300 GHz ($3\times10^8$ to $3\times10^{11}$ Hz). Furthermore, the present invention is useful in high frequency applications such as transmit/receive modules and radar applications. Still further, some of the embodiments of the present invention are useful in the formation of microwave circuit components including, but not limited to: antenna, filters, baluns, beam former, I/O's, couplers, feedthroughs (via or EM coupled), wirebond connection, and transmission lines.

Formulation of Thick Film Compositions (Pastes)

The thick film via fill compositions of the present invention may be prepared according to the following general methodology. The inorganic solids noted above may be mixed with the organic medium and dispersed with suitable equipment, such as a three-roll mill, to form a suspension, resulting in a composition for which the viscosity will be in the range of 300-1000 Pascal-seconds at a shear rate of 4 sec-1 for the thick film paste via fill capacitor composition. In one embodiment the viscosity is in the range of 350 to 450 Pascal-seconds at a shear rate of 4 sec-1 .

The ingredients of the paste, minus about 2-5% of the organic components, may be weighed together in a container. The components can then vigorously mixed to form a uniform blend; then the blend may then be passed through dispersing equipment, such as a three roll mill, to achieve a good dispersion of particles. A Hegman gauge may be used to determine the state of dispersion of the particles in the paste. This instrument consists of a channel in a block of steel that is 25 um deep (1 mil) on one end and rams up to 0" (i.e., 0-25 um range) depth at the other end. A blade may be used to draw down paste along the length of the channel.

Next, the remaining 2-5% of the organic components of the paste may be added, and the resin content may be adjusted, as necessary, to bring the viscosity of the composition to the desired value.

The composition may then be applied to a substrate, such as alumina or similar refractory ceramics, in one embodiment, to "green tape".

The "green tape" is generally formed by casting a 1-20 mil, preferably 2-10 mil, thin layer of a slurry dispersion of the glass and ceramic filler fine particulates, polymeric binder(s) and solvent(s) as described in the art of "tape casting" into a flexible substrate, and heating the cast layer to remove the volatile solvent. The tape is blanked into sheets or provided in roll form. This green tape is used as an insulating substrate for multilayer electronic circuits/devices, in place of conventional substrates, such as alumina and other refractory ceramic substrates. The green tape sheet is blanked with registration holes at the four corners; and via holes to connect the different layers of conductors using mechanical punching. The size of via holes varies depending on circuit design and property requirements. The interconnections of circuit between conductor track layers of the tape are typically applied by screen printing the conductive inks in the via holes.

After each layer of tape is printed with capacitor vias and electroded both sides of the vias with either conductor caps and/or conductor lines and conductor via holes as appropriate to the circuit design, the individual layers are collated, laminated and pressed using uniaxial or isostatic pressing die and techniques as described elsewhere in the art of tape pressing/lamination techniques. It will be recognized by those skilled in the art that in each of the laminating steps the printed tape layers must be accurate in registration so that the conductor vias are properly connected to the appropriate conductive lines of the adjacent functional layer, and in the case of conductor thermal vias, each via will be connected appropriately to the next one.

Firing to effect sintering of the green tape compositions and of the inorganic binder as well as the finely divided particles of metal, is preferably done in a well ventilated belt conveyor furnace or programmed box furnace with a temperature profile that will allow de-polymerization of polymers; and/or burnout of the organic matter at about 300-600° C., a period of maximum temperature of about 800-950° C., lasting about 5-20 minutes, followed by a controlled cool down cycle to prevent over-sintering and crystal growth, unwanted chemical reactions at intermediate temperatures, or substrate/fired ceramic tape fracture from too rapid cool down. The overall firing procedure will preferably extend over a period of between 3.5 to 5 hours, and in certain cases it could take up to 24 hours or more depending on the number of layers of green tapes laminated together and/or the thickness of the green tape layers.

The fired thickness of the via-fill capacitor can range from about 25 to about 100 um, depending on the percent of the via-fill, the thickness of the tape and degree of sintering of the inorganic solids.

The capacitor compositions (i.e., the thick film paste via fill capacitor compositions) of this invention can be printed as film onto the green tapes or ceramic substrates, or onto other thick films either by using an automated printer or a hand printer in the conventional manner. Preferably, automation screen printing techniques are employed, using 200 to 325 mesh screen with 0.5 um emulsion thickness. Conventional stencil printing techniques are also can be used.

Typical dielectric "green" tapes useful in the present invention include those disclosed in U.S. Pat. No. 6,147,019. Additionally, DuPont Product Nos. 951 Green Tape™, 943 Green Tape™ and 944 Green Tape™, (available from E. I. du Pont de Nemours and Company) are further examples those useful in the present invention.

EXAMPLE 1

A tape laminate comprising fourteen metallized tape layers arranged in the order from top to bottom: three primary, one self-constraining, six high dielectric constant (k=2000) one self constraining and three primary, was prepared by conventional tape processing techniques and then co-fired at 850° C. using a three and one half hour cycle. After firing, laminate shrinkage was 0.2% in the x- and y-directions and 38.9% in the z-direction. Electrodes were designed to be 0.25 inch by 0.25 inch square and the average capacitance of each capacitor, measured at 1 Mega-hertz, was 50 nano-Farads with a variance of ±5%.

EXAMPLE 2

A tape laminate comprising six metallized layers of high dielectric constant tape (k=2000) was prepared by conventional tape processing techniques and fired at 850° C. using a three and one half hour cycle. After firing, laminate shrinkage was 9.3% in the x- and y-directions and 14.6% in the z-direction. Three layers of metallized primary tape were then laminated sequentially to both sides of the fired high dielectric constant core using low lamination pressures and temperature. The whole was then fired at 850° C. The x- and y-dimensions of the structure did not decrease further during this second firing at 850° C. because the fired core constrained the shrinkage of the primary tape.

Electrodes were designed to be 0.25 inch by 0.25 inch square after firing so the approximately 18% reduction in total area was compensated for in the artwork used to make the screen printing pattern. The average capacitance of each capacitor, measured at 1 Mega-Hertz, was 36 nano-Farads with a variance of ±5%.

EXAMPLE 3

A tape laminate comprising twelve metallized tape layers arranged in the order from top to bottom: three primary, one self-constraining, four high dielectric constant (k=500) one self constraining and three primary, was prepared by conventional tape processing techniques and then co-fired at 850° C. using a three and one half hour cycle. After firing, laminate shrinkage was 0.3% in the x- and y-directions and 38.2% in the z-direction. Electrodes were designed to be 0.25 inch by 0.25 inch square and the average capacitance of each capacitor, measured at 1 Mega-hertz, was 8 nano-Farads with a variance of ±5%.

EXAMPLE 4

A tape laminate comprising two metallized layers of high dielectric constant tape (k=500) was prepared by conventional tape processing techniques and fired at 850° C. using a three and one half hour cycle. After firing, laminate shrinkage was 10.4% in the x- and y-directions and 13.2% in the z-direction. Three layers of metallized primary tape were then laminated sequentially to both sides of the fired high dielectric constant core using low lamination pressures and temperature. The whole was then fired at 850° C. The x- and y-dimensions of the structure did not decrease further during this second firing at 850° C. because the fired core constrained the shrinkage of the primary tape.

Electrodes were designed to be 0.25 inch by 0.25 inch square after firing so the approximately 18% reduction in total area was compensated for in the artwork used to make the screen printing pattern. The average capacitance of each capacitor, measured at 1 Mega-Hertz, was 2.5 nano-Farads with a variance of ±5%.

What is claimed is:

1. A method of producing a co-fired ceramic circuit using a thick film via fill paste composition comprising the steps of:
   (i) providing a high dielectric sheet with via holes,
   (ii) filling said via holes with said thick film via fill paste composition of $BaTiO_3$ 66 wt %, lead germanate glass 4 wt %, and an organic medium 30 wt %, based upon the weight of the total via fill paste composition, and wherein said lead germanate glass comprises, in weight percent glass, 78.5% $Pb_3O_4$ and 21.5% $GeO_2$,
   (iii) drying said via fill paste composition in said filled via holes by heating at 120° C. to 150° C.,
   (iv) applying a layer of conductor paste to said high dielectric sheet with filled via holes to form at least two layers, and
   (v) sintering said at least two layers to form a multilayer low temperature cofired ceramic circuit.

* * * * *